ically vaporize the material to be deposited, namely, silicon. Well known and conventional techniques may be used. Still other well known techniques such as chemical vapor deposition or sputtering may also be used.

United States Patent [19]
Auston

[11] 4,326,126
[45] Apr. 20, 1982

[54] HIGH SPEED PHOTODETECTOR
[75] Inventor: David H. Auston, Mountainside, N.J.
[73] Assignee: Bell Telephone Laboratories, Incorporated, Murray Hill, N.J.
[21] Appl. No.: 107,901
[22] Filed: Dec. 28, 1979
[51] Int. Cl.³ .............................................. H01J 40/14
[52] U.S. Cl. ................................................. 250/211 J
[58] Field of Search ...................... 250/211 R, 211 J; 357/29, 30, 2; 338/15

[56] References Cited
U.S. PATENT DOCUMENTS 3,917,943  11/1975  Auston ............................. 250/211 J
4,142,195  2/1979  Carlson et al. .......................... 357/2
4,163,677  8/1979  Carlson et al. .......................... 357/2
4,217,148  8/1980  Carlson ................................ 357/30

OTHER PUBLICATIONS

"Amorphous Semiconductors", by Tauc Physics Today, Oct. 1976, pp. 23–31.

*Primary Examiner*—David C. Nelms
*Attorney, Agent, or Firm*—Richard D. Laumann

[57] ABSTRACT

A high speed photodetector using an amorphous semiconductor, such as silicon, and having a localized state density of at least $10^{18}/cm^3$ is described. The amorphous silicon may be prepared by evaporation or chemical vapor deposition or sputtering.

10 Claims, 1 Drawing Figure

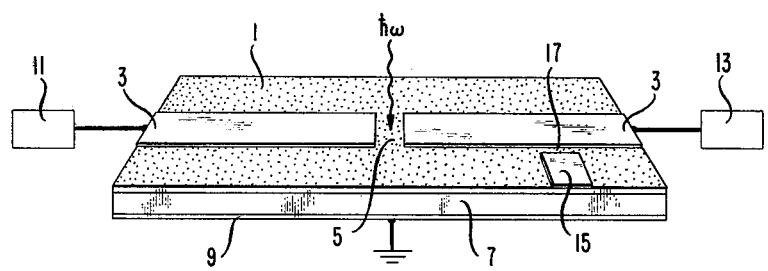

HIGH SPEED PHOTODETECTOR

TECHNICAL FIELD

This invention relates generally to optical devices and particularly to photodetectors using amorphous semiconductors.

BACKGROUND OF THE INVENTION

The detection of electromagnetic radiation in the visible and near visible regions of the electromagnetic spectrum has stimulated scientific and technological interest for many years. Interest in such detection was perhaps first stimulated by the desire to detect light from distant stars and as a result telescopes were developed for optical astronomy.

For many purposes, methods of detection other than the visual methods first used by astronomers are desirable if not mandatory. The methods that have been developed are varied and include photographic emulsions and solid state devices that use photoconductors, p-n junctions, charge coupled devices, etc. These methods have been developed to their highest technological levels for different specialized uses. For example, photoconductors are often used to measure light intensity for photographic purposes and highly sensitive photodiodes have been developed for use in optical communications systems using glass fibers.

The interest in photodetectors for specialized purposes has often been stimulated by developments in other areas of technology. For example, the development of tunable lasers emitting very brief light pulses, nanoseconds or shorter, that are typically of very high intensity has for the first time opened many new opportunities for time resolved spectroscopy of very fast physical, chemical and biological phenomena. Unfortunately, the detection of such pulses has proven to be more difficult than their generation.

Several detection systems are currently available and used to study very fast phenomena. Streak cameras presently have the best time resolution but suffer the significant drawbacks of being both complex and expensive. For example, a price of $50,000 per camera is typical. Semiconductor junction diodes are often employed for the alignment and monitoring of pulses from picosecond lasers. However, although a response time of approximately 50 picoseconds has been reported in the literature, the commercially available detectors generally have response times of only 100 picoseconds. The response time of this and the other available optical detection systems is slower than the optical pulses and complicated nonlinear optical correlation techniques must be used to obtain the desired time precision. Faster response times would still be desirable.

One field that has stimulated considerable excitement in recent years, especially the last 20 years, is that of amorphous semiconductors. The materials have attracted attention because of their photosensitive properties. This field was first of interest because of the well known xerographic copying process that uses arsenic doped amorphous selenium. More recently, memory devices and solar cells using amorphous semiconductors have generated widespread interest although difficulties have been encountered in reproducing results.

The experimental work has been accompanied by an increased theoretical understanding of amorphous semiconductors. The understanding has led to an appreciation of the importance of localized states such as defects. A complete understanding of the effects of localized states and defects has not, however, been achieved. Nor has a complete understanding of the effect of impurities, e.g., hydrogen in amorphous silicon, been achieved.

Due to the lack of theoretical understanding, as well as other reasons, amorphous semiconductors have not been successfully used as high-speed photodetectors, i.e., detectors having response times less than 50 picoseconds.

SUMMARY OF THE INVENTION

It has been found that a photodetector with a response time less than 50 picoseconds may be constructed using a thin film of an amorphous semiconductor having a localized state density of at least $10^{18}/cm^3$. In a preferred embodiment, the semiconductor is silicon having a localized state density as estimated by electron spin resonance of at least $3\times10^{18}/cm^3$ and a thickness of several absorption lengths. The amorphous silicon may be deposited by any of the conventional and well known methods such as evaporation, sputtering, or the thermal decomposition of silane. Alternatively, a crystalline material may be rendered amorphous by radiation damage or ion implantation. In the preferred embodiment, the substrate is conveniently made of 0.2 mm thick silica. A microstrip transmission line in the form of end-on aluminum electrodes is evaporated onto the surface of the silicon thin film with a narrow gap between the electrodes being used as the active area of the detector. A uniform ground plane is evaporated onto the bottom surface of the substrate.

BRIEF DESCRIPTION OF THE DRAWING

The FIGURE is a perspective view of a photodetector of the invention.

DETAILED DESCRIPTION

The photodetector of this invention is shown generally in perspective in the FIGURE. For reasons of clarity, the drawing is not to scale. A thin film 1 of an amorphous semiconductor has an electrode 3 on one surface. In the embodiment depicted, electrode 3 is in the form of a microstrip transmission line, typically formed of aluminum, and has a gap 5 that forms the active or photosensitive area. If desired, as explained below, electrode 15 spaced from electrode 3 by gap 17 may be present. Design considerations of a microstrip transmission line are discussed in detail in U.S. Pat. No. 3,917,943. The thin film 1 of the amorphous semiconductor is deposited on substrate 7. The side of substrate 7 opposite to film 1 has upon it a ground plane 9 that is typically formed of aluminum. Input transducer 11 is a voltage source that serves to bias the photoconductor and utilization means 13 detects the output and includes devices such as a sampling oscilloscope. The ground plane should be impedance matched to means 13.

Other electrode configurations can be used. However, the signal from the optical pulse must be transmitted rapidly to the utilization means for best time resolution and the transmission speed depends upon electrode configuration. The configuration described has been found to have good transmission characteristics.

The electrodes depicted are 200 μm wide and 5 mm long. Although other configurations can be used, the configuration depicted has the advantage that the electrode capacitance is distributed in the form of a transmission line and does not limit the response time. The size of the gap is typically between 20 and 50 microns for good response times. The gap between the electrodes depicted is 20 μm long and has a negligible capacitance of approximately $10^{-14}$ farads. The active area is approximately 4000 microns$^2$.

One of the transmission lines is charged to bias the photodetector. To prevent excessive electromigration of the electrode material across the gap, the electric field should be less than approximately $5 \times 10^4$ V/cm. A bias voltage of 40 volts has been found to yield good results although voltages between 20 and 200 volts can be used depending upon the size of the gap.

Film 1 consists of an amorphous semiconductor. For purposes of this specification, amorphous means lacking long range order, i.e., beyond the first several atomic spacings, from any given atom, the atomic distributions become random. The semiconductor may be prepared in the amorphous state or alternatively, it may be prepared in the crystalline state and then rendered amorphous by such techniques as subjecting it to high energy radiation which destroys the long range order or ion implantation which also destroys the long range order.

Amorphous semiconductors are characterized by extended states and localized states. The wave functions of localized states extend for only several atomic spacings while the wave function of the extended states extend for much greater distances. The states are distinguished by differing electronic mobilities. The mobility for an extended state is typically 1 cm$^2$/V.sec while that of a localized state is typically 2 to 3 orders of magnitude smaller. The localized states act to terminate the photocurrent and their density should be at least $10^{18}$/cm$^3$ to obtain the desired fast response time of 50 picoseconds or less. The origin of localized states is not completely understood but many are thought to arise from defects. The most common defect is a broken bond in which atoms do not share an electron. The result is a "dangling bond." Dangling bonds may be produced by microvoids and vacancies and are conventionally characterized experimentally by electron spin resonance measurements. Although any amorphous semiconductor having an appropriate number of dangling bonds may be used, the invention will be described with respect to amorphous silicon.

The film 1 is conveniently prepared by the evaporation of silicon onto fused silica substrates that are conveniently 0.2 mm thick. The evaporation is conveniently conducted at any temperature between room temperature and 300 degrees C. Alternatively, a process that uses the thermal decomposition of silane, commonly referred to as chemical vapor deposition, may be used. The silane is diluted in a carrier gas that typically is either hydrogen or argon. The substrate temperature should be between 200 degrees C. and 250 degrees C. At 600 degrees Kelvin, the film is deposited at the rate of approximately 2 microns/hour. Additionally, sputtering may be used. The absorption threshold for silicon is approximately 1.6 eV and the absorption length is 0.25 microns for a photon energy of 2 eV. The thickness of the amorphous semiconductor is perhaps more conveniently described in terms of absorption lengths than in terms of microns and should be at least 2 absorption lengths at the wavelengths of interest.

The density of dangling bonds as determined by electron spin resonance should be at least $3 \times 10^{18}$/cm$^3$ for the desired fast response time and was measured to be approximately $10^{19}$/cm$^3$ for the CVD silicon material and approximately $10^{20}$/cm$^3$ for the evaporated silicon material.

The response time was measured using pulses from a cw Rh6G laser that was synchronously pumped by a mode locked Ar ion laser. The duration of the dye laser pulse was estimated to be 3 picoseconds. The laser was tunable over the range from approximately 510 nm to approximately 640 nm and had a pulse repetition rate of about 94 MHZ. The rise time of the signal observed by the utilization means 13, in this case, sampling oscilloscope connected to electrode 3 was 25 ps with a full width at half maximum of 40 ps. No measurable dc signal was observed between pulses. Up to an average power level of approximately 50 mW, the response was linear as a function of incident light intensity. Above this level, saturation was observed although no damage to the detector was observed at a power level of 100 mW.

The following model of the photodetector is hypothesized to explain the rapid response time. The photocurrent, $I_s$, may be represented by the formula $I_s = \eta(1-R)(1-e^{-\alpha d})(e/\hbar\omega)(\mu\tau)(V_b/l^2)p$ where $\eta$ is the quantum efficiency for the production of free carriers, R is the optical reflectivity, $\alpha$ is the absorption constant for the amorphous silicon, d is the thickness of the amorphous film, ($\hbar\omega/e$) is the photon energy in volts, $\tau$ is the carrier life time, and $V_b$ is the bias voltage, l is the gap length, and P is the peak optical power averaged over the system response time of 40 picoseconds. Assuming that $\eta = 1$, $r = 0.65$, $\alpha = 4 \times 10^4$ cm$^{-1}$, $d = 4 \times 10^{-5}$ cm, $\hbar\omega/e = 2$ ev, $V_b = 40$ volts, and $l = 2 \times 10^{-3}$ cm, the product of $\mu\tau$ is approximately equal to $3 \times 10^{-11}$ cm$^2$/V. The effective lifetime, $\tau$, of the mobile carriers cannot be greater than the duration of the observed current impulse and is approximately 30 picoseconds. As a result, the carrier mobility is estimated to be at least 1 cm$^2$/V. This value is typical of the mobility expected for extended states in amorphous silicon. For a carrier of 0.1ev kinetic energy, it corresponds to a mean free path of at least 1 Angstrom.

However, the carriers in localized state, have mobilities that are several orders of magnitudes smaller than the mobilities of carriers in the extended states. Carriers excited by 2 ev photons are initially in extended states. These carriers then thermalize into localized states by a process that is presumably characterized by photon emission. Hence, the photoresponse consists of an initial current impulse due to photoexcited carriers that are created by light, represented by $\hbar\omega$, incident on gap 5. The carriers initially are in relatively mobile extended states and rapidly thermalize to the immobile localized states and thus terminate the photocurrent. A high defect density leads to more localized states and a more rapid response time. There is a slower recombination process which then occurs, but it does not contribute to the photocurrent although it may effect the saturation behavior of the detector when used at high repetition rates.

The collection efficiency or photoconductive gain of the detectors is approximately $3 \times 10^{-4}$ for the embodiment described. The fast response time leads to a compromise in sensitivity because most of the current carriers relax before reaching the electrodes. This efficiency corresponds to a mean carrier drift distance of approximately 100 Angstroms. The efficiency can, of course, be improved by using either smaller gap geometries or higher bias films. The increase in efficiency is offset by a decrease in response time.

An electrical pulse such as that produced in electrode 3 by illumination of gap 5 may be sampled by illuminating gap 17 after illuminating gap 5 and then detecting the pulse in electrode 15. There will be conduction between electrodes 3 and 15 for a time that is determined by the decay time of the carriers produced in the gap. During this time, the pulse in electrode 3 is sampled. By varying the time between illumination of gaps 5 and 17, different portions of the pulse produced in gap 5 may be sampled. Any electrical pulse in electrode 3 may be sampled by this method. That is, voltage source 11 may produce a pulse which travels down a now, gapless electrode 3 and is sampled by the illumination of gap 17. Gap 17 is typically between 5 and 50 microns. Shorter distances can be used for gap 17 than for gap 5 because the bias voltage is smaller and of a shorter duration and electromigration is less of a problem.

I claim:

1. A device comprising a substrate, a layer of an amorphous semiconductor disposed on said substrate, and having a thickness of at least two absorption lengths, first and second electrodes, said first electrode being disposed on said semiconductor, said second electrode being disposed on said substrate, and an active area, characterized in that said amorphous semiconductor has a localized state density of at least $10^{18}/cm^3$.

2. A device as recited in claim 1 in which said semiconductor is silicon.

3. A device as recited in claim 2 which said amorphous silicon has a localized state density of at least $3 \times 10^{18}/cm^3$.

4. A device as recited in claim 3 in which said amorphous silicon film has a thickness of approximately 0.5 microns.

5. A device as recited in claim 4 in which said electrode disposed upon said amorphous silicon is a microstrip transmission line, said line having a gap.

6. A device as recited in claim 5 in which active area is formed by said gap.

7. A device as recited in claim 5 in which said gap is between 20 microns and 50 microns.

8. A device as recited in claim 7 in which said active area is approximately 4000 microns$^2$.

9. A device as recited in claim 2 further comprising a third electrode, said third electrode being disposed on said surface of said semiconductor and being spaced from said first electrode.

10. A device as recited in claim 1 in which said third electrode is spaced from said second electrode by a distance in the range from approximately 5 microns to approximately 50 microns.

* * * * *